United States Patent
Ikkink et al.

(10) Patent No.: US 7,580,275 B2
(45) Date of Patent: Aug. 25, 2009

(54) CONTROL OF A MEMORY MATRIX WITH RESISTANCE HYSTERESIS ELEMENTS

(75) Inventors: Teunis Jan Ikkink, Geldrop (NL); Pierre Hermanus Woerlee, Valkenswaard (NL); Victor Martinus Van Acht, Waalre (NL); Nicolaas Lambert, Waalre (NL); Albert W. Marsman, Valkenswaard (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/817,754

(22) PCT Filed: Mar. 3, 2006

(86) PCT No.: PCT/IB2006/050672

§ 371 (c)(1),
(2), (4) Date: Jun. 3, 2008

(87) PCT Pub. No.: WO2006/095295

PCT Pub. Date: Sep. 14, 2006

(65) Prior Publication Data

US 2009/0122590 A1 May 14, 2009

(30) Foreign Application Priority Data

Mar. 9, 2005 (EP) .................................. 05101821

(51) Int. Cl.
*G11C 11/00* (2006.01)
(52) U.S. Cl. .................................................... 365/148
(58) Field of Classification Search .................. 365/148
See application file for complete search history.

(56) References Cited

U.S. PATENT DOCUMENTS 5,793,697 A 8/1998 Scheuerlein (Continued)

FOREIGN PATENT DOCUMENTS

EP 1381054 A1 1/2004

OTHER PUBLICATIONS

Symanczyk, Ralph; et al "Electrical Characterization of Solid State Ionic Memory Elements" Proceedings of the Non-Volatile Memory Technology Symposium, San Diego, CA, 17-1, 2003.

(Continued)

*Primary Examiner*—Huan Hoang
*Assistant Examiner*—Jay Radke

(57) ABSTRACT

A control circuit (1, 11) for a memory matrix is used that defines a write process that uses circuit state transitions between at least two idle circuit states, an all column update circuit state and a column selective update state. In the second. During access the control circuit switches back and forth to the column selective update state (W) from the first idle state (II) during execution of a column selective update command and back and forth to the all-column update state (E) from the second idle state (12) during execution of an all column update command. The control circuit (1, 11) is retained in the first and second idle state (II, 12), without switching to the second and first idle state (12, II) between execution of successive column selective update commands and all column update commands respectively.

7 Claims, 9 Drawing Sheets

U.S. PATENT DOCUMENTS

| | | |
|---|---|---|
| 5,818,749 A | 10/1998 | Harshfield |
| 5,991,193 A | 11/1999 | Gallagher et al. |
| 6,426,891 B1 | 7/2002 | Katori |
| 7,035,137 B2 * | 4/2006 | Iwata et al. ............... 365/158 |
| 7,499,315 B2 * | 3/2009 | Lowrey et al. ............. 365/163 |
| 2004/0047179 A1 * | 3/2004 | Tanizaki et al. ............ 365/171 |
| 2004/0114413 A1 | 6/2004 | Parkinson |
| 2006/0171194 A1 * | 8/2006 | Lowrey et al. ............. 365/154 |

OTHER PUBLICATIONS

Lai, Stefan; et al "OUM-A 180 NM Nonvolatile Memory Cell Element Technology for Stand Alone Embedded Applications" Proceedings, IEDM 2001, pp. 36.5.1-36.5.4.

Sakamoto, T; et al "Nanometer-Scale Switches Using Copper Sulfide" Applied Physics Letters, vol. 82, No. 18, 2003, pp. 3032-3034.

* cited by examiner

CONTROL OF A MEMORY MATRIX WITH RESISTANCE HYSTERESIS ELEMENTS

The invention relates to a circuit with a matrix of memory cells that contain resistance hysteresis elements. A resistance hysteresis element is an electric circuit element with a resistance that can assume one of at least two values under influence of a history of voltage or currents that have been applied to the terminals of the device.

U.S. Pat. No. 6,426,891 discloses a non-volatile memory with a memory matrix that contains cells that each contain a series arrangement of a thin film phase change material and a diode. The thin film phase change material exhibits a hysteresis effect: the material remains in one of two states, dependent on the voltage values that have been previously applied across the material. During a read operation the state can be detected because state dependent currents occur when a voltage is applied across the phase change material, i.e. its resistance depends on the state. (Resistance, as used in this respect refers to the ratio of voltage and current of the element for at least one operational voltage. It is not required that the resistance remains the same for all values of the voltage across the resistance hysteresis element).

U.S. Pat. No. 6,426,891 uses diodes to provide selective access to cells in the memory matrix. The diodes function as voltage selective conductors that keep unselected cells passive when the voltage difference that is applied over diodes in unselected cells remains between the forward and reverse breakdown voltage of the diodes. In this way the diodes replace more conventional three terminal access transistors, with the effect that a higher density memory can be realized. A write effect occurs when the voltage difference across the series arrangement in a cell exceeds a write threshold that equals the forward or reverse breakdown voltage plus a hysteresis threshold voltage of the hysteresis element.

In resistance hysteresis memories a voltage difference of one polarity at these cells is used to update the logic content of the cells to logic "one", and a voltage difference of opposite polarity is used to update the content of the cells to logic "zero". Furthermore, a non-destructive read operation is used wherein the voltage difference over a cell exceeds the forward or reverse breakdown voltage of the diode by less than the write threshold.

Typically, the updates are part of erase operations and write-data operations. During an erase operation all cells along a selected row are set to a first logic value. During a write-data operation cells in data dependent columns are set to a second logic value, opposite the first logic value. Thus, there are two type of update operations: all-column update operations, in which the hysteresis elements in the cells of all columns along a selected row are driven to the same state, and column selective state update operations wherein only the hysteresis elements in the cells of selected columns along a selected row are driven to the same state.

The update operations are performed driving a first low or high row voltage to first terminals of the cells in a row and a second voltage to second terminals of the cells in those columns were a state change is required. The second voltage differs from the first voltage by a sufficient amount to cause state changes in the resistance hysteresis elements that are in the selected rows and columns. The first terminals of cells in other rows and the second terminals of cells in other columns are kept at intermediate voltages that are intermediate between the first and second voltage, so that voltage differences that exceed the forward or reverse breakdown voltages of the cell diodes develop over none of the cells in these rows and columns.

Typical writing processes are controlled by a control circuit that operates as a state machine, switching back and forth between an idle state, wherein the terminals of all cells are kept at the intermediate voltages, and write state wherein the terminals of cells in selected rows and columns are driven to the first and second voltage. When a large memory matrix is used, this switching back and forth between the idle state and the write state involves considerable power consumption, especially when the voltage has to be changed for many columns.

Among others, it is an object of the invention to reduce the power consumption involved with the effecting of state changes in resistance hysteresis elements during operation of a matrix of cell with such elements.

A circuit according to the invention is set forth in Claim 1. According to the invention the control circuit that controls the update operations provides for two different types of idle state for all-column and column selective update operations. During execution of a column selective update operation the control circuit switches back and forth to a column selective update state from a first idle state and during execution of an all-column update operation the control circuit switches back and forth to an all-column update state from a second idle state. Between update operations, the control circuit remains in the last used idle state, first switching to the other idle state only if the next update operation is of a different type from the preceding update operation. One could say that thus the control circuit also exhibits hysteresis: it remains in one of a plurality of idle states dependent on a last previous update operation.

In the first idle state, for column selective update operations, the voltages of all rows and columns are driven to intermediate values. In the second idle state, for all-column operations, the column voltages are kept at the same value as during the update of the resistance hysteresis elements in the all-column update operations, while only the row voltages are driven to a voltage that differs from the voltage in the all-column update operation. Use of the second idle state for all-column update operations reduces power consumption, while use of the first idle state for column selective update operations prevents that signal rise or fall time variations can lead to accidental updates of cells in unselected columns.

Preferably, the all-column and column selective update operations involve voltage differences of mutually opposite sign across the memory cells, so that they define erase and write data operations respectively. However, the invention may also be applied to all-column and column selective update operations that use voltage differences of the same sign, for example for write-all-ones and write data dependent ones operations respectively.

In an embodiment the control circuit has an input to receive access command signals, including write-data commands and erase commands. In response to a command signal for a write data command the control circuit switches to the first idle state from the second idle state, if it is not already in the first idle state, and then switches to the column selective write state and back to the first idle state. In response to a command signal for an erase command the control circuit switches to the second idle state from the first idle state, if it is not already in the second idle state, and then switches to the all-column write state and back to the second idle state.

In a further embodiment the command signals include read commands. In this embodiment the control circuit defines a read state. In response to a read command the control circuit switches to the read state from the first or second idle state, dependent on a previous operation, without passing through the second or first idle state respectively. That is, the control circuit defines respective state sequences for switching to the read state from the first and second idle state, so that neither sequence includes the other. In this way faster switching to the read state is possible.

These and other objects and advantageous aspects of the invention will be described using exemplary embodiments illustrated in the following figures.

Figure 11A:
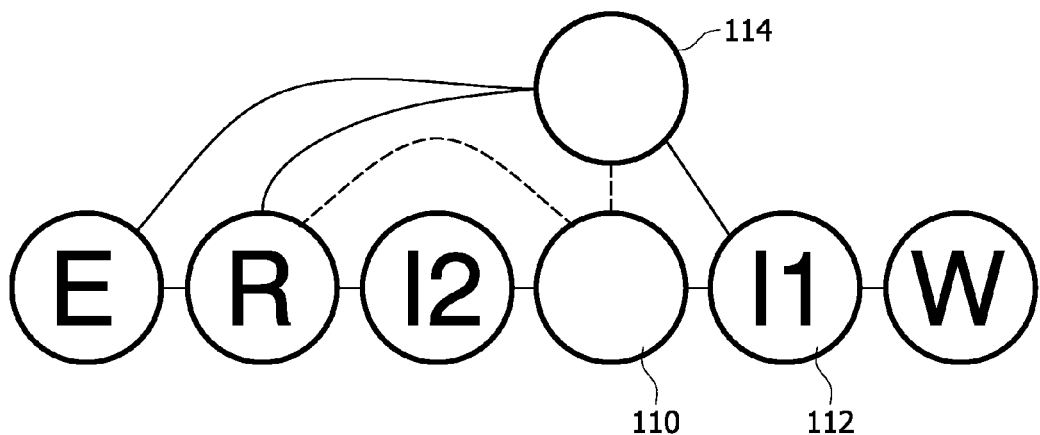

FIGS. 11a,b show state diagrams of a control circuit

Figure 12A:
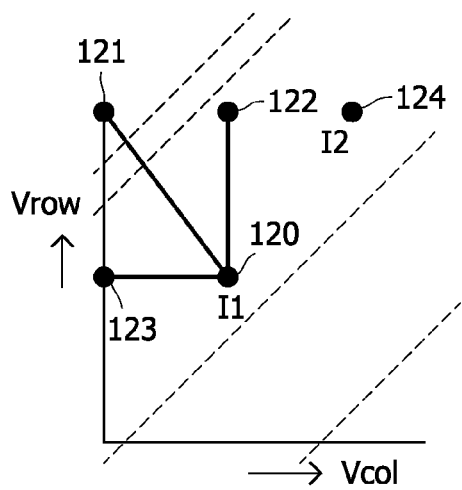
Figure 12B:
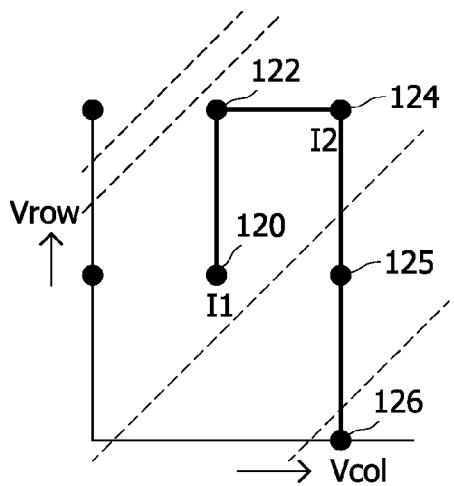
Figure 12C:
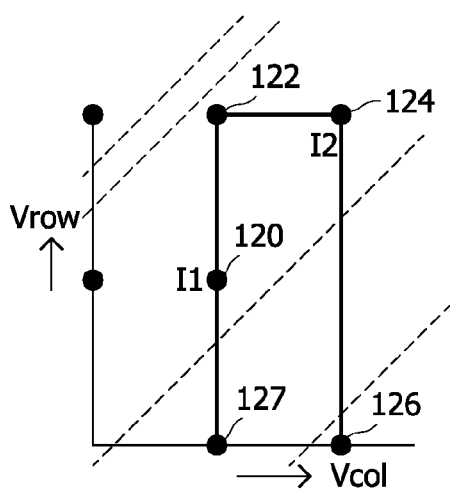

FIGS. 12a-c shows voltage diagrams

Figure 1:
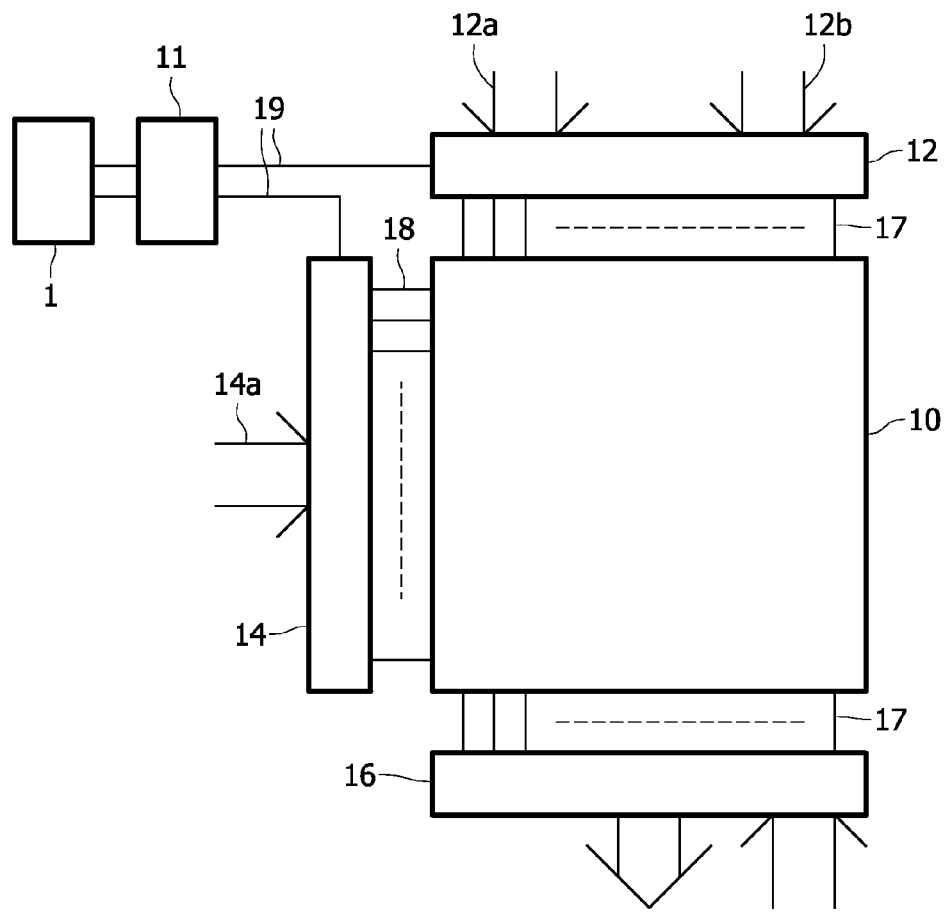
FIG. 1 shows a memory circuit
Figure 2:
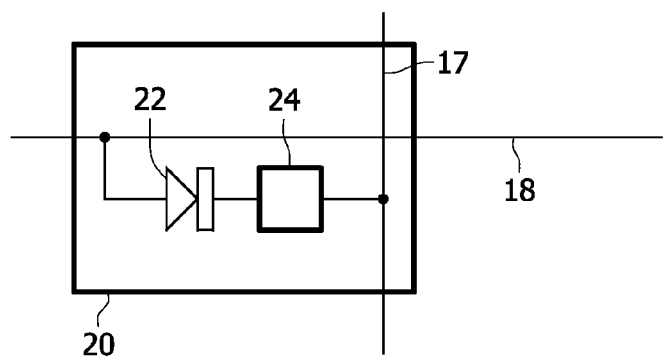
FIG. 2 shows a memory cell

FIG. 1 shows a memory circuit, comprising a matrix 10 of memory cells. The cells are not shown individually. FIG. 2 shows an example of a memory cell 20. The cell contains a diode 22 and a resistance hysteresis element 24 (also referred to as hysteresis element for short). Matrix 10 contains a plurality of column conductors 17 and a plurality of row conductors 18 (also called bit lines and word lines respectively), so that each cell is associated with a unique combination of a row conductor 18 and a column conductor 17. In cell 20 diode 22 and resistance hysteresis element 24 are coupled in series between the associated row conductor 18 and column conductor 17 of the cell 20.

Figure 3:
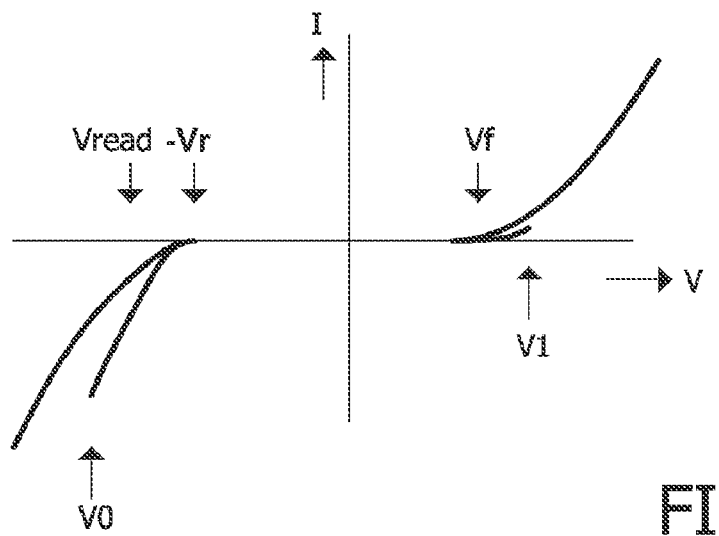
FIG. 3 illustrates voltage margins during use of the memory circuit

FIG. 3 illustrates driving margins for cell 20. The voltage drop V from row conductor 18 to column conductor 17 is plotted horizontally and current through the series connection of diode 22 and resistance hysteresis element 24 is plotted vertically. Diode 22 has a forward breakdown voltage Vf and a reverse breakdown voltage Vr. As can be seen the cell conducts virtually no current when the voltage drop is between these two values. When the voltage drop V exceeds these values a current will flow. The size of this current depends on the state of hysteresis element 24, i.e. the resistance depends on the state. (Resistance, as used in this respect refers to the ratio of voltage and current of the element for at least one operational voltage. It is not required that the resistance remains the same for all values of the voltage across the resistance hysteresis element).

Although in practice the resistance of the hysteresis element can assume one of three or more values, for clarity it is assumed here that the hysteresis element can be in one of two states. Since the hysteresis element can be in one of two states, two different current values are possible above Vf and below Vr until write thresholds V1 and V0 are reached respectively.

Hysteresis element 24 is forced to a first predetermined state when the voltage drop V rises above a first write threshold V1, which equals the forward breakdown voltage Vf plus a forward hysteresis threshold of hysteresis element 24. Similarly, hysteresis element 24 is forced to a second predetermined state when the voltage drop V falls below a second write threshold V0, which has a size equal to the reverse breakdown voltage Vr plus a reverse hysteresis threshold of hysteresis element 24. The reverse hysteresis threshold is significantly larger than the forward hysteresis threshold, as can be seen from the fact that the distance between the second write threshold V0 and the reverse breakdown voltage Vr is significantly larger than the distance between the forward breakdown voltage Vf and the first write threshold V1.

Any suitable type of resistance hysteresis element may be used. Examples may be found in the art. One example is the article "Electrical characterization of solid state ionic memory elements", by Ralf Symanczyk, Murali Balakrishnan, Chakravarthy Gopalan, Thomas Happ, Michael Kozicki, Michael Kund, Thomas Mikolajick, Maria Mitkova, Mira Park, Cay-Uwe Pinnow, John Robertson and Klaus-Dieter Ufert and published in Proceedings of the Non-Volatile Memory Technology Symposium, San Diego, Calif., 17-1 (2003). Another example is the article "OUM—A 180 nm Nonvolatile Memory Cell Element Technology For Stand Alone and Embedded Applications" by Stefan Lai and Tyler Lowrey and published in the IEDM 2001 conference proceedings. A further example is the article "Nanometer-scale switches using copper sulfide" by T. Sakamoto, H. Sunamura, and H. Kawaura, T. Hasegawa, T. Nakayama, and M. Aonob, published in applied physics letters volume 82, number 18, pages 3032-3034.

FIG. 1 shows a computer-processing unit 1, a control circuit 11, a write circuit 12, a row selection circuit 14 and a sensing circuit 16. Write circuit 12 has a data input 12a, an optional address input 12b and outputs coupled to column conductors 17. Row selection circuit 14 has an address input 14a and outputs coupled to row conductors 18. Control circuit 11 is coupled to write circuit 12 and row selection circuit 14 via control lines 19. Sensing circuit 16 has inputs coupled to column conductors 17 and an output for outputting data. Optionally sensing circuit 16 has an address input. For the sake of clarity sensing circuit 16 has been shown separately from write circuit 12, but it should be understood that sensing circuit 16 will typically be combined with write circuit 12. Computer processing unit 1 may be coupled to the address input, the data output and the control inputs of the memory. For clarity only the connections for control signals are shown. Typically, all parts of the memory are included in a common integrated circuit and the computer-processing unit is located in an external integrated circuit.

In operation the memory circuit receives at least row addresses and performs read operations, write operations and erase operations for selected rows.

Figure 4:
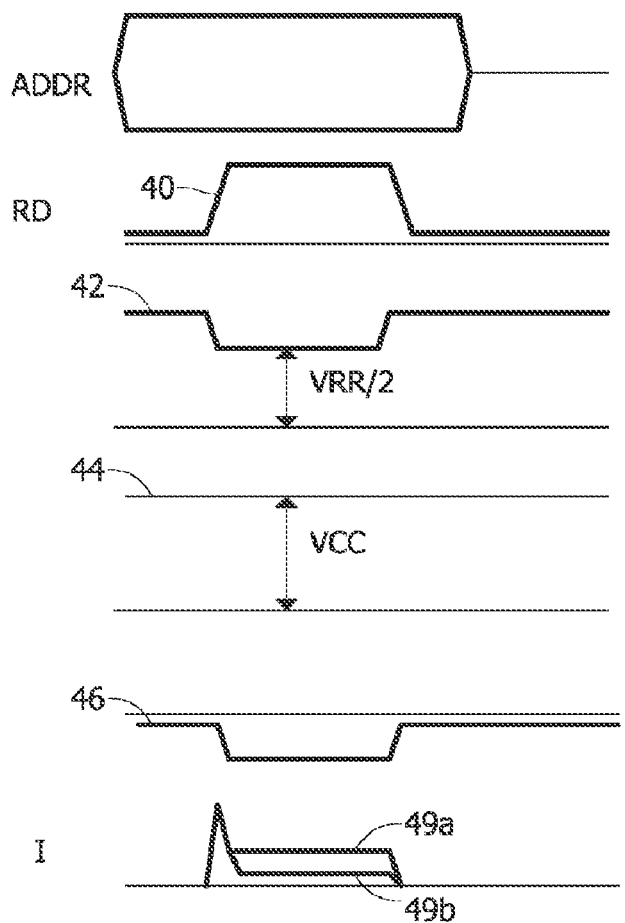
FIG. 4 shows an example of voltages applied during reading

FIG. 4 is used to illustrate a read operation. During the read operation a read address is applied to row driving circuit 14. Control circuit 11 receives a command to perform reading and in response it applies a read control signal 40 to signal the read operation to row driving circuit 14. In response to read control signal 40 row driving circuit 14 applies a driving voltage VRR/2 to one of row conductors 18 that is selected by the applied address. Selected row signal 42 shows the selected row conductor voltage. Row driving circuit 14 allows the voltage of the other row conductors 18 to float (i.e. row driving circuit 14 presents a high impedance to these unselected row conductors). During reading column driving circuit 12 forces all column conductors 17 substantially to assume a voltage VCC. Column signal 44 shows the column conductor voltage.

As a result, the voltage difference 46 across memory cells in the selected row will assume a value Vread=VRR/2−VCC, which has been indicated in FIG. 3. As can be seen Vread lays between the second write threshold V0 and the reverse breakdown voltage −Vr, that is, in the largest of the two ranges wherein the current through the cell depends on the state of hysteresis element 24. In this range the current through the cell depends on the state of hysteresis element 24.

Unselected row conductors 18 are discharged via the cells until the unselected cells become nonconductive. Typically the voltage drop across cells in unselected rows becomes slightly closer to zero than −Vr, the reverse breakdown voltage of diode 22. Therefore the resulting column conductor current 49a,b depends on the state of the hysteresis element 24 in the selected row.

During the read operation sensing circuit 16 senses the currents through the column conductors and uses the sensed current to derive read data. In an embodiment sensing circuit 16 outputs read data for all columns. In an alternative embodiment sensing circuit 16 outputs read data only for columns selected by a column address.

Figure 5:
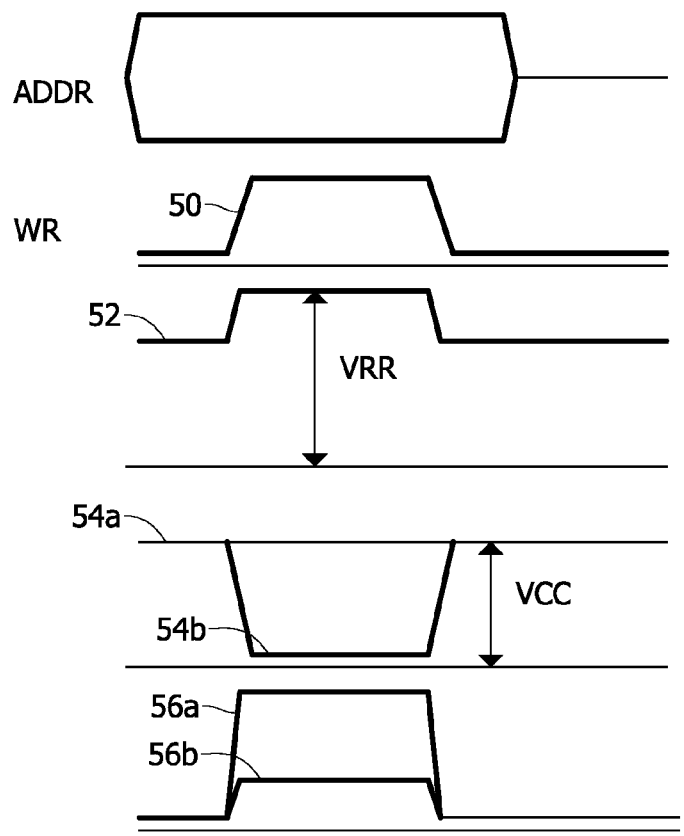
FIG. 5 shows an example of voltages applied during programming

FIG. 5 is used to illustrate a write operation. During the write operation a write address is applied to row driving circuit 14. Control circuit 11 uses a write control signal 50 to signal the write operation to row driving circuit 14. In response to write control signal 40 row driving circuit 14 applies a driving voltage VRR to one of row conductors 18 that is selected by the applied address. Selected row signal 52 shows the selected row conductor voltage. Row driving circuit 14 allows the voltage of the other row conductors 18 to float (i.e. row driving circuit 14 presents a high impedance to these unselected row conductors).

During writing column driving circuit 12 receives data signals for respective columns. Column driving circuit 12 forces data dependent column conductors 17 substantially to assume a voltage zero and other column conductors 17 substantially to assume a voltage VCC. Column conductors 17 for columns for which the data is a logic one are forced to zero voltage and column conductors 17 for columns for which the data is a logic zero are forced to VCC voltage. Column signals 54a,b shows the column conductor voltages. In an embodiment column driving circuit 12 outputs data dependent voltages for all columns. In an alternative embodiment column driving circuit 16 forces all but a number of address column conductors substantially to assume the voltage VCC and forces data dependent voltages only on addressed column conductors 17.

As a result, the voltage difference 56a,b across memory cells in the selected row will assume a value Vwrite=VRR or VRR−VCC. VRR lies above the first write threshold V1 and VRR−VCC lies between the forward and reverse breakdown voltages Vf, −Vr of diode 22. As a result the hysteresis elements 24 of the cells wherein logic one data must be written in the selected rows are forced to assume a predetermined first state. The state of the hysteresis elements 24 in the other cells of the selected row is not changed.

Figure 6:
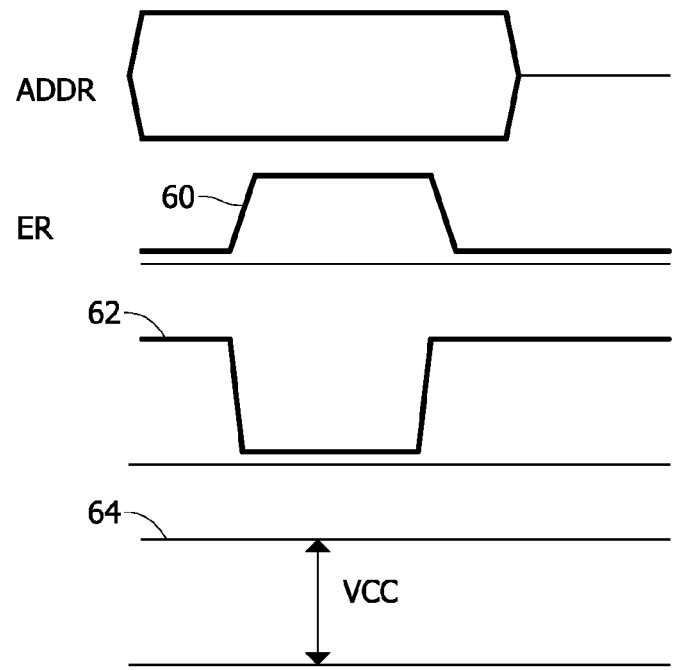
FIG. 6 shows an example of voltages applied during erasing

Unselected row conductors 18 are discharged via the cells until the unselected cells become non conductive. Typically the voltage drop across cells in unselected rows becomes slightly closer to zero than Vf, the forward breakdown voltage of diode 22. Therefore the state of the hysteresis elements 24 in the unselected rows is not changed. FIG. 6 is used to illustrate an erase operation. During the erase operation an erase read address is applied to row driving circuit 14. Control circuit 11 uses an erase control signal 60 to signal the ease operation to row driving circuit 14. In response to erase control signal 60 row driving circuit 14 applies a driving voltage of zero to one of row conductors 18 that is selected by the applied address. Selected row signal 62 shows the selected row conductor voltage. Row driving circuit 14 allows the voltage of the other row conductors 18 to float (i.e. row driving circuit 14 presents a high impedance to these unselected row conductors). During erasing column driving circuit 12 forces all column conductors 17 substantially to assume a voltage VCC. Column signal 64 shows the column conductor voltage.

As a result, the voltage difference across memory cells in the selected row will assume a value Verase=−VCC. Verase lies below the second write threshold V0. Therefore the hysteresis elements of the cells in the selected row are forced to assume the second predetermined state. Column driver circuit 12 applies the voltage VCC to all column conductors so that cells in the selected row in all columns are erased.

Unselected row conductors 18 are discharged via the cells until the unselected cells become nonconductive. Typically the voltage drop across cells in unselected rows becomes slightly closer to zero than −Vr, the reverse breakdown voltage of diode 22. Therefore no erasing takes place in the unselected rows.

As will be appreciated it is not possible to write data into selected cells in a row only by erasing. Typically, a complete write process involves an erasing operation for all cells in a selected row, followed by a write operation for data dependent cells in the selected row. The erase operation and next following write operation may be far apart in time. For example, a few cells may be written shortly after erasing and other cells may be written much later.

It should be appreciated that FIGS. 4-6 merely show examples of nominal signals. In practice deviations from these nominal signals may occur, for example due do the use of other voltages in the driver circuits or due to voltage drop along the column conductors 17 and/or row conductors 18. As long as these deviations are within certain bounds the operation of reading, writing and erasing is not affected.

During reading the voltage drop across a selected cell should remain between −Vr and −(Vr plus the reverse hysteresis threshold). This margin is relatively wide because the read polarity has been selected so that use is made of the broadest of the hysteresis thresholds. A significantly smaller margin would have been available if, contrary to the embodiment, reading would have taken place with voltages between Vf and Vf plus the forward hysteresis threshold. This is because the reverse hysteresis threshold is significantly larger than the forward hysteresis threshold.

The following bounds apply during writing. First of all, it must be ensured that there exist voltage values for the unselected row conductors so that no current will be drawn from memory cells in unselected rows if such voltage values occur at the unselected row conductors. This implies that during selective writing the distance between the voltages of the column conductors should be less than the sum of the forward and reverse breakdown voltages of diode 22. That is, the difference between the voltage Vwrite across cells in columns where a logic one is written and the voltage Vwrite' across cells in columns where no logic one is written should satisfy $$|Vwrite - Vwrite'| < Vr + Vf$$

(Herein positive voltages are used for Vr and Vf, so that the diode breaks down at minus Vr). Furthermore, during writing the voltage drop across selected cells should rise above Vf plus the forward hysteresis threshold. The voltage drop across unselected cells should remain between −Vr and Vf.

The first condition defines a "budget" of usable combinations of voltages across memory cells in the selected row during writing. The second and third conditions define a "forbidden" range in that budget: the cell voltages should not lie between Vf and Vf plus the forward hysteresis threshold, since voltages in such a range do not lead to writing of cells to be written nor prevent current from flowing through the other cells in the selected row.

In the embodiment that has been shown, the available range that remains from the budget is relatively large, because the "forbidden" range that corresponds to the forward hysteresis threshold corresponds to the smallest of the hysteresis thresholds. Thus a relatively large range of usable voltages can be provided both for Vwrite and Vwrite'.

If, contrary to the embodiment, writing to selected cells in a row would have been realized with cell voltages below minus (Vr plus the reverse hysteresis threshold), a significantly larger forbidden range (the reverse hysteresis threshold) would be eaten out of the available budget, because the reverse hysteresis threshold is larger than the forward hysteresis threshold. As a result, significantly narrower margins would have been available for Vwrite and Vwrite'.

During erasing there is only one relevant margin for the cells in the selected row: the voltage drop across the cells should be below −(Vr plus the reverse hysteresis threshold). Because all cells are treated in the same way there is only one relevant margin. Because of this the fact that the reverse hysteresis threshold is relatively large does not present problems.

The conditions on the voltages can be summarized as follows:

for reading (to ensure that there is current through the cell but no writing):

$$Vr < VCC - VRR/2 < Vr + \text{reverse hysteresis threshold} \quad (1)$$

for writing (to ensure that selected cells in a selected row are updated):

$$VRR > Vf + \text{forward hysteresis threshold} \quad (2)$$

for writing (to ensure that unselected cells in a selected row do not carry current):

$$VRR - VCC < Vf \quad (3)$$

for writing (to ensure that cells in unselected rows do not carry current):

$$VCC < Vr + Vf \quad (4)$$

for erasing (to ensure that all cells in a selected row are updated):

$$VCC > Vr + \text{reverse hysteresis threshold} \quad (5)$$

The circuit is designed so that the relevant voltages satisfy these conditions. Since these conditions involve inequalities, the conditions do not define any specific combination of voltage values, but rather a range of allowable combinations of voltage values. Preferably, VRR is set so that the nominal voltage Vread across the selected cells during reading is substantially halfway between the reverse bias voltage of diode 22 and this reverse bias voltage plus the reverse hysteresis threshold. This balances the risks that deviations from the nominal Vread lead to unintentional state changes of hysteresis element 24 and that diode 22 hardly breaks down, so that insufficient current is available for sensing. To realize this, VRR/2 preferably substantially equals $$VCC - (Vr + \text{half the reverse hysteresis threshold})$$

When, as in the embodiment of FIGS. 4-6, VRR (twice this voltage) is used for writing, it is also necessary that $$Vf + VCC > VRR > Vf + \text{the forward hysteresis threshold}$$

Figure 7:
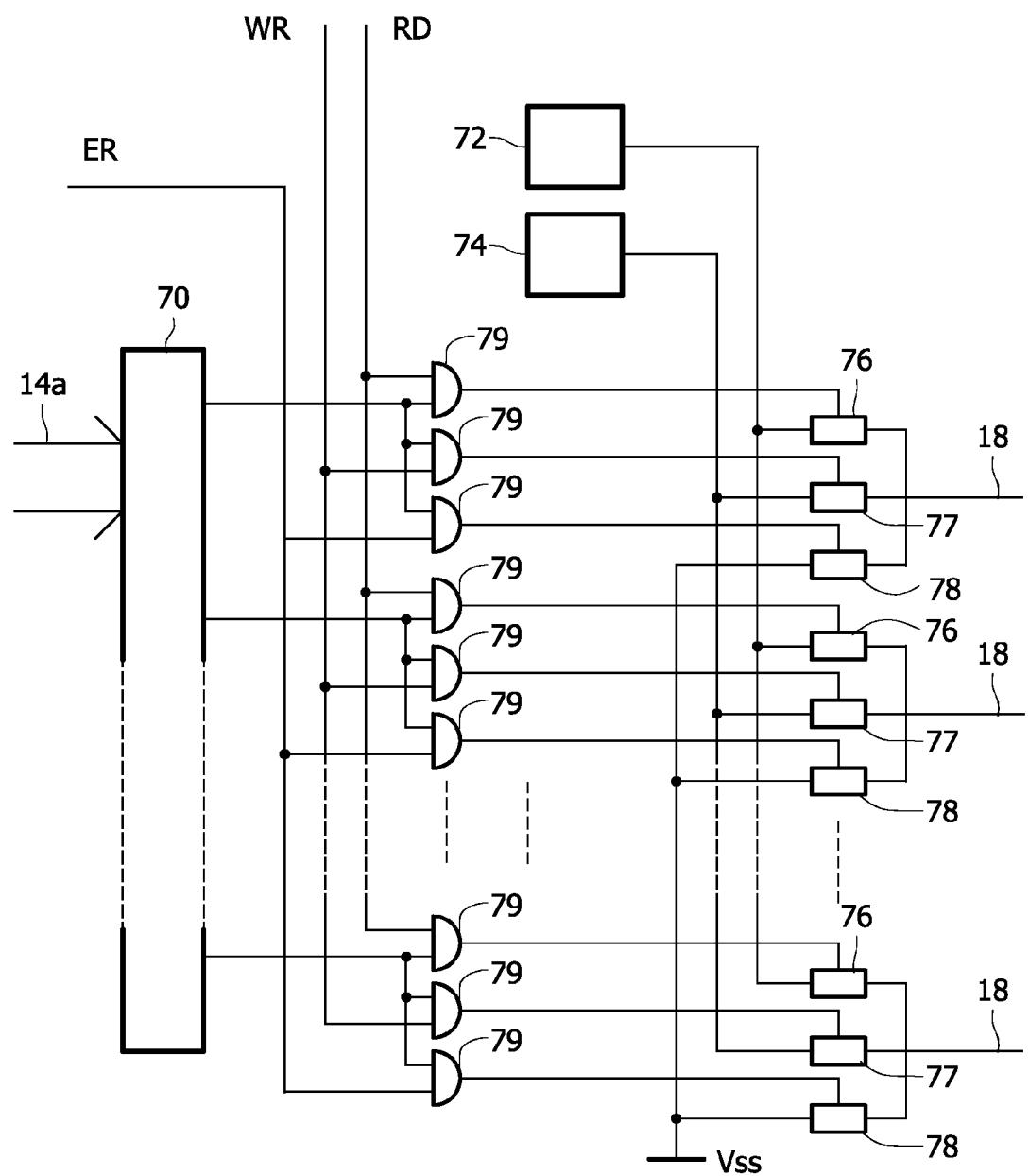
FIGS. 7, 7a show examples of column driver circuits

This ensures that a state change will be effected during writing in the selected cells in the selected row, but not in the unselected cells. It will be appreciated that the invention is not limited to the use of VRR and VRR/2 for writing and reading respectively. Unrelated voltages may be used, in which case the preceding conditions apply separately. FIG. 7 shows an example of a row driver circuit, which comprises an address decoder 70, a first and second voltage source circuit 72, 74, switching circuits 76, 77, 78 and AND gates 79. Each of row conductors 18 is coupled to outputs of first and second voltage source circuit 72, 74 and ground (Vss), via respective switching circuits 76, 77, 78. Address decoder 70 has decoded selection outputs coupled to first inputs of AND gates 79. Second inputs of AND gates 79 are coupled to read, write and erase control lines (RD, WR, ER). The outputs of AND gates are coupled to control inputs of switching circuits 76, 77, 78.

In operation, first and second voltage source 72, 74 supply an output voltage of VRR and VRR/2 respectively. An address is applied to address input 14a of address decoder 70. In response address decoder 70 outputs a logic one at an output for a selected row and logic zeros at outputs for the other rows. As a result switching circuits 76, 77, 78 of unselected rows electrically isolate row conductors 18 for the unselected rows from the rest of the circuit. As regards the row conductor 18 of the selected row, this row conductor 18 is left electrically isolated or connected to the output of first voltage source 72, second voltage source 74 or ground (Vss) dependent on control signals at the read, write and erase control lines (RD, WR, ER).

Figure 7A:
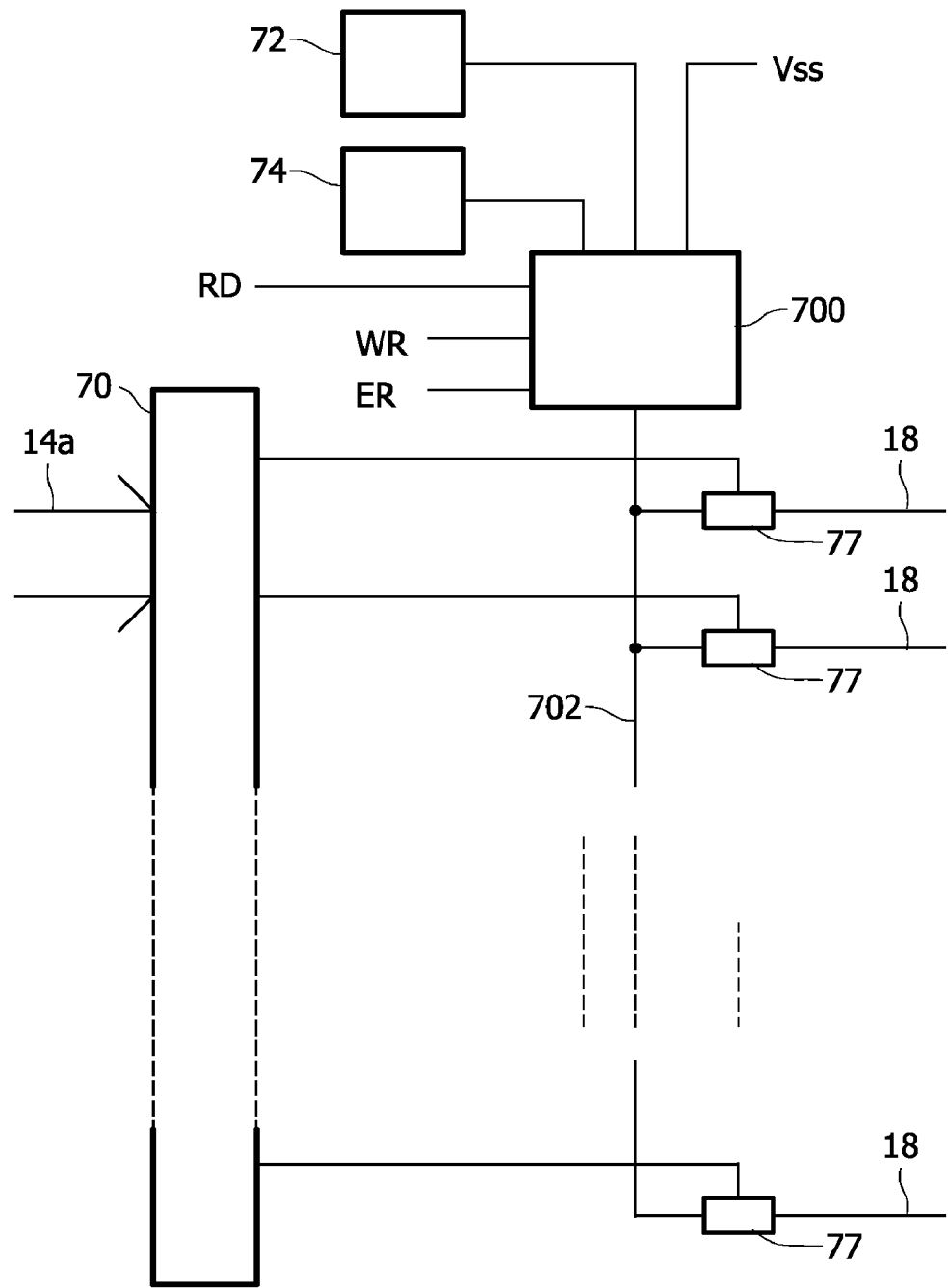

FIG. 7a illustrates an alternative row driver circuit, wherein a common multiplexer 700 and a common voltage distribution conductor 702 are provided for all rows. Common multiplexer 700 is controlled by control signals that indicate whether reading, writing or erasing is needed (by way of example by three control lines RD, WR, ER, but of course other forms of signalling may be used). In response to these control signals multiplexer 700 applies one of three voltages VCC, VRR or VRR/2 to common voltage distribution conductor 702. Respective switch circuits 77 are provided for respective rows for connecting a selected row conductor to common voltage distribution conductor 702, under control of the row address. It may be noted that this row driver circuit requires relatively few components, so that a high-density memory circuit is possible. Only one switch 77 is needed for each row, and one common voltage source conductor 702 suffices for all rows. Multiplexer 700 can also be kept relatively simple, allowing common voltage distribution conductor 702 to float electrically when no access is needed.

Figure 8:
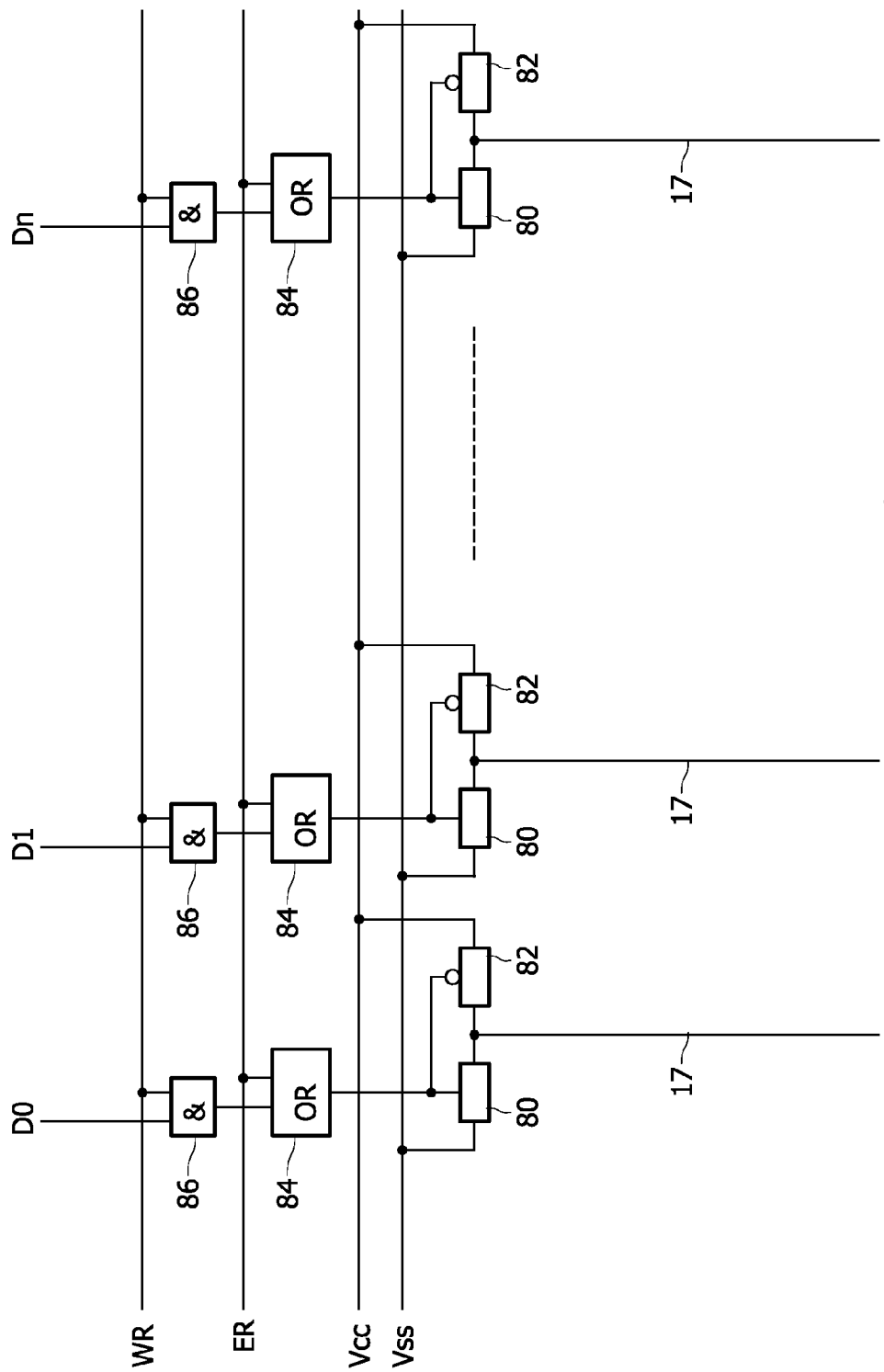
FIG. 8 shows an example of a row driver circuit

FIG. 8 shows an example of a column driver circuit. The column driver circuit comprises switching circuits 80, 82, OR gates 84 and AND gates 86. Each row conductor 17 is coupled to a first power supply VCC and ground (Vss), via a first switching circuit 80 and a second switching circuit 82 respectively. Respective AND gates 86 are provided for respective ones of the columns. Each AND gate 86 receives a write selection signal WR and a data signal from a respective data input (D0, D1, . . . Dn). Respective OR gates 84 are provided for respective ones of the columns. The OR gate 84 of each column receives an erase selection signal ER and an output signal from the AND gate 86 for the column. An output of the OR gate 84 is coupled to a control input of the first switching circuit 80 that is coupled between the column conductor for the column and ground (Vss). The output of the OR gate 84 is coupled to an inverted control input of the second switching circuit 80 that is coupled between the column conductor for the column and a power supply VCC.

In operation the driver circuit couples each column conductor 17 either to ground (Vss) or to the power supply VCC. A column conductor 17 is coupled to ground when both the write signal is asserted and logic one is present at the data input of the relevant column. Otherwise the column conductor 17 is coupled to the power supply VCC. Thus, erase occurs collectively for all columns, independent of the data and write occurs selectively, dependent on the data.

Sensing circuit 16 senses the currents through the column conductors 17 and derives digital signals dependent on whether the currents are above or below a threshold that discriminates between the different hysteresis states. Any convenient type of sensing circuit may be used. For example, current-sensing circuits may be combined with second switching circuits 82 which couple the column conductors 17 to the power supply VCC. In this case the currents running from the power supply VCC to column conductors 17 are measured.

Figure 9:
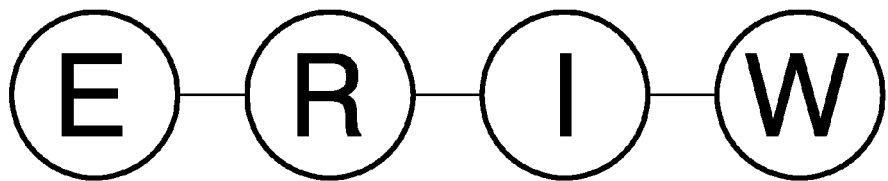
FIG. 9 shows a state diagram of a control circuit

FIG. 9 shows a state diagram of states involved during driving according to the preceding embodiment. In an embodiment the control circuit is implemented as a state machine that is designed to assume these states and to switch between the states in response to access commands. Four states are shown: an idle state I, a read state R, an erase state E and a write state W. In the idle state I the control circuit controls the driver circuits so that all row conductors 18 are left electrically floating and the column conductors are driven to VCC. The read state R differs from the Idle state in that a selected row conductor is driven to VRR/2. The erase state E differs from the Idle state in that a selected row conductor 18 is driven to zero voltage Vss. The write state W differs from the idle state in that data dependent column conductor is driven to zero (Vss) and the remaining column conductors 17 are driven to VCC, whereas a selected row conductor 18 is driven to VRR. Normally the circuit is in the idle state, and transitions to the other states are made when writing reading or erasing is required.

It should be emphasized that the various driver circuits have been shown and described merely by way of example. Any other circuit that applies suitable voltages may be used. There is some freedom in the selection of the various voltages involved in the circuit, provided that the voltages satisfy the conditions that have been set forth. Also, of course, it does not matter whether a general offset is applied to all voltages used during reading or to all voltages used during writing or to all voltages used during erasing. For example different column line voltages may be used for reading and erasing, with all other voltages correspondingly shifted.

Preferably these voltages are selected so that maximum safety margins remain for fluctuations of the row conductor and/or column conductor voltages.

A number of relevant safety margins can be defined.

(a) The safety margins during reading, that is, the distances from the nominal voltage across the selected cells to (i) the reverse diode break down voltage (in this case defined as the minimum voltage that is necessary to elicit sufficient current through a memory cell so that the sense amplifier can distinguish different programming levels), (ii) the voltage across the memory cell at which a state change occurs, i.e. the reverse diode break down voltage plus the reverse hysteresis threshold.

(b) The safety margins during writing. These include first of all (i) the distance between the voltage across selected cells and the forward breakdown voltage of diode 22 plus the forward hysteresis threshold and (ii) the distance between the voltage across unselected cells and the forward breakdown voltage of diode 22. Furthermore, since different voltages are applied to the column conductors during writing, there is a safety margin that is (iii) the distance between the sum of the forward and reverse diode breakdown voltages and the difference between the highest and lowest voltages on the column conductor. This ensures that cells in unselected rows do not conduct.

(c) The safety margin during erasing, that is, the distance between the voltage across selected cells and the reverse breakdown voltage of diode 22 plus the reverse hysteresis threshold.

The size of the safety margins should preferably at least be as large as the upper bound on expected deviations in the voltages due to fluctuations, the length of conductors etc. Typically the size of these upper bounds is the same during reading writing and erasing, so that the same minimal safety margins are required in each case.

The safety margins during reading are limited by the reverse hysteresis threshold. Preferably the hysteresis elements are constructed so that this reverse hysteresis threshold is at least sufficiently large to accommodates margins equal to the upper bound of the expected deviations D above and below the nominal read signal. When the same upper bounds D above and below the nominal voltages occur, this means that the hysteresis threshold should be at least twice the expected upper bounds:

$$2D < \text{reverse hysteresis threshold}$$

(It will be understood that the > and < signs, as used herein, include substantial equality, when D is an upper bound that is higher than any normal deviation). Preferably, hysteresis elements are constructed so that the reverse hysteresis threshold substantially equals twice the expected upper bounds D. This minimizes power consumption. The voltage Vread across the memory cell should satisfy $$-(Vr + \text{the reverse hysteresis threshold}) < V\text{read} < -Vr$$

When the reverse hysteresis threshold equals twice D, Vread is preferably selected so that this inequality substantially becomes an equality and Vread is midway between the reverse diode break down voltage and the voltage across the memory cell at which a state change occurs.

It has been found that, of the three safety margins for writing, usually only two are critical: the distance between the voltage across selected cells and the forward breakdown voltage plus the forward hysteresis threshold and the distance between the sum of the forward and reverse diode breakdown voltages and the difference between the highest and lowest voltages on the column conductor. Typically, each of these safety margins should equal at least the size D of the upper bounds of the deviations that have been mentioned for reading. From this it is possible to derive conditions on the voltage "Vwrite" across the memory cells wherein data is written and on "Vdiff" the difference between nominal voltages on different column conductors:

$$V\text{write} > D + Vf + \text{the forward hysteresis threshold}$$

$$V\text{diff} < Vf + Vr - D$$

Preferably, values of Vwrite and Vdiff are used that substantially turn these inequalities into equalities. This minimizes power consumption.

In the case of the preceding embodiment Vdiff=VCC and Vwrite=VRR. Furthermore, in this embodiment $$V\text{read} = V\text{write}/2 - V\text{diff}$$

This means that the inequalities for Vwrite, Vdiff and Vread can be combined to produce the following inequalities $$-(Vr+Vf/2-3D/2-\tfrac{1}{2}*\text{the forward hysteresis threshold})$$
$$<V\text{read}<-(Vr+D)$$

From this it follows that in the preceding embodiment a value for Vread is possible only if $$Vf>5*D+\text{the forward hysteresis voltage}$$

The circuit is preferably constructed so that this inequality is substantially an equality.

This selection of voltages has the effect that other relevant margins are also satisfied.

In the embodiment that has been shown the voltage of the unselected row conductors is allowed to float. In this way, accidental writing or reading is generally prevented. The voltages of these unselected row conductors will automatically float to a safe value. Such a safe value (at which there are no current paths from one column conductor to another via pairs of cells that are connected to the unselected row conductor) is ensured to exist as long as the voltage differences between the selected and unselected column conductors does not exceed the sum of the forward and reverse bias voltages of the diode 22 of a cell.

However, it should be appreciated that alternatively the voltages of the unselected row conductors may be driven to safe values which are less than a forward diode breakdown voltage above the lowest column conductor voltage and at the same time less than a reverse diode breakdown voltage below the highest column conductor voltage. Under some circumstances this can be disadvantageous because it requires accurate drivers if the distance between the lowest column conductor voltage and the highest column conductor voltage is near the sum of the forward and reverse diode breakdown voltages. However, under other circumstances it can be advantageous to drive the unselected word lines.

Figure 10:
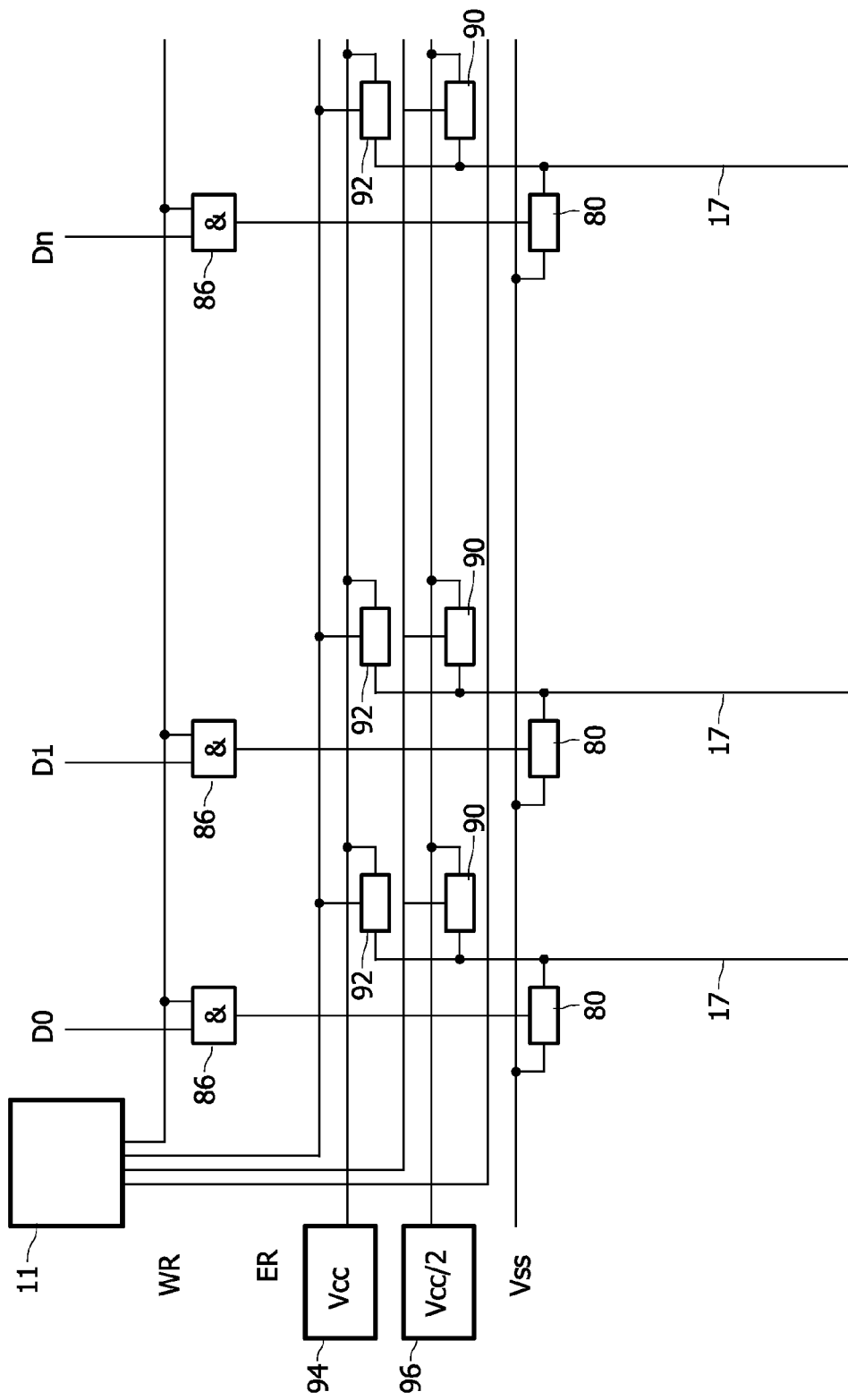
FIG. 10 shows a further column driver circuit

FIG. 10 shows an alternative embodiment of the column driver circuit for use in combination with driving of all row conductors 18. In this embodiment a first and second voltage source circuit 94, 96 are provided in the column driver circuit for driving voltages to column conductors 17. By way of example these voltage sources supply voltages of VCC and VCC/2. For each column switches 90, 92 are provided that couple the column conductor 17 of the column to the respective voltage sources 94, 96. A ground terminal Vss is coupled to the column conductors via further switches 80. Switches 90, 92 are controlled by control circuit 11. Further switches 80 are controlled by a combination of signals from control circuit 11 and data signals D0, D1, Dn. The driver circuit of FIG. 10 is used in an embodiment wherein all row conductors 18 are driven, not just the row conductor of the selected row.

FIGS. 11a,b shows state diagrams of driving in an embodiment wherein all row conductors 18 are driven. These diagrams describe how control circuit 11 controls the row and column driver circuits.

In the embodiment of FIG. 11a the idle state (termed the second idle state I2 in the context of FIG. 11a), read state R and erase state E are the same as in FIG. 8 except that all row conductors 18 are driven towards definite voltages. In the second idle state I2 all row conductors 18 are driven to VRR. In the read state R all unselected row conductors are driven to VRR and an address selected row conductors is driven to VRR/2. In the erase state all unselected row conductors are driven to VRR and an address selected row conductor 18 is driven to zero (Vss). In the write state all unselected row conductors 18 are driven to VRR/2 and an address selected row conductor 18 is driven to VRR. In the write state W there is the additional difference that column conductors 17 of columns where no data is written are driven to half VCC.

In addition to the second idle state I2, the read state R, the erase state E and the write state W the state diagram contains an additional first idle state I1 and a number of intermediate states to which the control circuit switches when it passes to or from the erase state E, the read state R and write state W. The idle state I1 and the intermediate states are provided to prevent excessive power consumption.

A first intermediate state 110 and first idle state I1 112 are provided between the second idle state I1 and the write state W. In first intermediate state 110 all row conductors are driven to VRR and all column conductors are driven to VCC/2 (by making switches 90 conductive). In first idle state 112 all row conductors are driven to VRR/2 while all column conductors are driven to VCC/2. When a write action is to be performed and the circuit is in the second idle state I2 the circuit switches from second idle state I2 to write state W via first intermediate states 110 and first idle state I1 successively. After writing the circuit switches back to first idle state I1.

Insertion of first idle state I1 112 prevents unwanted writing, because it drives the voltages of the unselected columns to VCC/2 before active column conductors are driven to zero voltage (Vss). First intermediate state 110 prevents that a state occurs wherein unselected row conductors 18 are driven to VRR/2 while all column conductors are driven to VCC. This would effectively correspond to a read action from all rows simultaneously, which would involve considerable power dissipation. This power dissipation is avoided by inserting first intermediate state 110 in the switching sequence prescribed by FIG. 11a, because it forces the column voltages to VCC/2 before changing the row voltages to VRR/2.

In an embodiment the control circuit is designed so that, when it executes a series of commands, it does not always return to the same idle state (first idle state I1 or second idle state). Instead, the control circuit is designed to remain in an idle state that corresponds to the last previous command. Typically, commands are issued by a computer-processing unit, as a result of execution of a program. The program may contain LOAD instructions, for loading data from the memory matrix, STORE instructions for writing data and ERASE instructions. (It will be assumed that execution of the "STORE" instruction involves no erasure, but requires a previously erased cell; alternatively, or in addition an ERASE-STORE instruction may be provided that involves erasure followed by storage). Furthermore a "block erase" instruction may be available, which is used to erase a range of consecutive addresses at once.

In response to instructions of these types the computer generates commands, in the form of control signals that it applies to the control circuit, in order to cause the control circuit to perform the required operations. Control circuit 11 switches back and forth between the erase state E and the write state W via both idle states I1, I2 when it receives commands derived from a sequence of instructions like

ERASE
STORE
ERASE
STORE

However, control circuit 11 first switches back and forth between second idle state I2 and erase state E (without entering first idle state I1 in between), next switches to first idle state I1 and subsequently switches back and forth between first idle state I1 and write state W when it receives commands derived from a sequence of instructions like

ERASE
ERASE

STORE
STORE

That is, after a write operation the control circuit switches back from write state W to first idle state I1 and remains in that state I1 until the next command is executed, but after an erase operation the control circuit switches back from erase E to second idle state I2 and remains in that state I2 until the next command is executed. If another write operation is executed after a previous write operation, the control circuit returns from the first idle state I1 to the write state W without first passing through the second idle state I2. If another erase operation is executed after a previous erase operation, the control circuit returns from the second idle state I2 to the erase state E without first passing through the first idle state I1. The control circuit normally switches from first idle state I1 to second idle state I2 only if an erase or read command follows a write command. Conversely, the control circuit normally switches from second idle state I2 to first idle state I1 only if a write command follows an erase or read command. In addition, of course, such state switches may be used during exceptional circumstances, such as power up, or switching to a sleep mode.

When read operations are involved as well, in one embodiment control circuit 11 is designed to switch to second idle state I2 (if it is not already in that state) before switching to the read state R, and remains in the second idle state I2 after switching back to that state after the read operation. That is, control circuit 11 does not return to the second idle state I2 between successive STORE instructions and does not return to the first idle state I1 between successive LOAD instructions during execution of a series of instructions like

STORE
STORE
LOAD
LOAD

In contrast control circuit 11 passes through both idle states in response to a program sequence like

STORE
LOAD
STORE
LOAD

FIG. 11a shows an optional second intermediate state 114 between on one hand erase state E and read state R and on the other hand first idle state 112 (and thereby between erase/read state E/R and write state W). Second intermediate state 114 differs from erase state E in that the selected row line is driven to VRR/2 instead of zero (Vss) and the column lines are driven to VCC/2 instead of VCC. Additional intermediate state 114 makes it possible to switch from erase state E to write state W or vice versa without passing through read state R. This shorter path speeds up combined write-erase actions. The second intermediate state 114 also prevents the unwanted power dissipation associated with a spurious read-out condition for all unselected rows.

Any path through the state diagram may be used, although some transitions, which are shown as dashed lines, are not preferred because they represent detours.

Figure 11B:
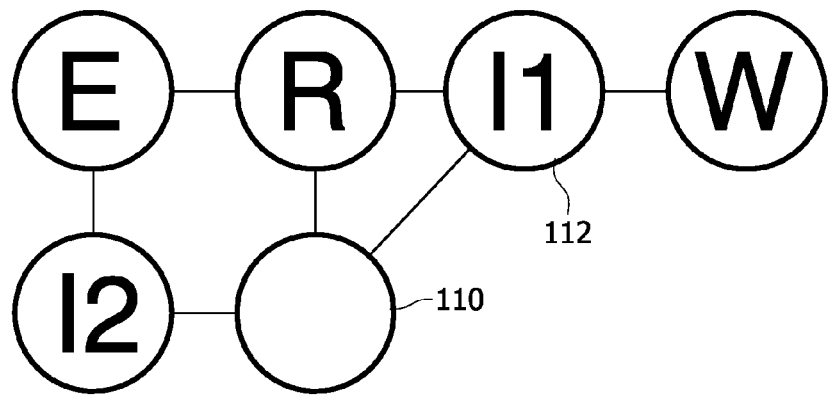

FIG. 11b shows an alternative state diagram. This diagram has the same first and second idle states I1, I2, erase state E and write state W, but different driving conditions are used in read state R. In the read state R of this diagram the row voltage of the address selected row is driven to zero (Vss) and the voltage of the column conductors is driven to VCC/2. The voltage of the unselected row conductors is driven to VRR as before. An advantage of using the state diagram of FIG. 11b is that fewer states are needed, which simplifies the control circuit and increases access speed. The diagram of FIG. 11a, however has the advantage that it involves less leakage current, because the voltage difference between unselected row lines and the column lines has been selected more favorably in the read state.

In a further embodiment, in particular when the state diagram of FIG. 11b is used, control circuit 11 may be designed to switch to and from the read state via different state sequences, dependent on the state in which the control circuit is at the reception of a read command. For example, if control circuit starts in second idle state in FIG. 11b control circuit 11 may pass from second idle state I2 via intermediate state 110 to read state R without passing through first idle state I1, and in contrast if control circuit 11 starts in first idle state I1 it will pass to read state R directly without passing through intermediate state 110. The first will happen in response to execution of a sequence of instructions like

ERASE
LOAD

The second happens in response to execution of a sequence of instructions like

STORE
LOAD

By designing control circuit 11 so that different state sequences are used for reaching the read state, dependent on the previous idle state, faster operation is possible. The following table summarizes the driving voltages for the diagrams of FIGS. 9 and 11a,b.

| Voltages During/at | FIG. 9 | FIG. 11a | FIG. 11b |
| --- | --- | --- | --- |
| Read/selected row | VRR/2 | VRR/2 | 0 |
| Read/unselected rows | Floating | VRR | VRR |
| Read/columns | VCC | VCC | VCC/2 |
| Erase/selected row | 0 | 0 | 0 |
| Erase/unselected rows | Floating | VRR | VRR |
| Erase/columns | VCC | VCC | VCC |
| Write/selected row | VRR | VRR | VRR |
| Write/unselected row | Floating | VRR/2 | VRR/2 |
| Write/active column | 0 | 0 | 0 |
| Write/passive column | VCC | VCC/2 | VCC/2 |

FIGS. 12a-c further illustrate the voltage used in these states and the transitions between these states. In these figures two-dimensional diagrams are shown, wherein each point corresponds to a combination of row and column voltages. The horizontal coordinate of the point represents the column voltage and the vertical coordinate represents the row voltage. Dashed lines represent the boundaries between voltage combinations at which the diodes do not conduct, voltage combinations where the diodes conduct but the hysteresis elements are not forced to a specific state and voltage combinations where the diodes conduct and the hysteresis elements are forced to a specific state.

FIG. 12a illustrates the effect of transitions between first idle state I1 (combination 120) and write state W. The combination 124 that corresponds to second idle state I2 is also indicated. In write state W four combinations of voltages 120, 121, 122, 123 occur, at cells in the selected row where data must be written (combination 121), cells in the selected row where no data is written (combination 122) cells in unselected rows and columns where data is written (combination 123) and cells in unselected rows and columns where no data is written (combination 120).

The transition from the first idle state I1 to write state W involves transitions from combination 120 to different ones of these combinations, dependent on the type of cell. Straight-line voltage paths are shown between the combinations. These correspond to the case that both voltages change at the same rate. If this is not the case curved voltage paths will occur. As may be noted, if these transitions were made from second idle state I2 instead of from first idle state I1 differences in speeds could lead to paths which entail accidental write or at least conduction of the diodes during the transition.

FIG. 12b illustrates the transitions to the read and erase states for the state diagram of FIG. 11a. Here combinations 125, 126 represent the voltages on the terminals of cells in selected rows during read and erase respectively. The terminal voltages for cells in unselected rows are represented by combination 124. Before read or erase the terminal voltages correspond to combination 124 (second idle state I2) and to actually perform the operation a transition to combinations 125 or 126 is made. As can be noted, the column voltage does not change during these transitions, which saves power consumption. If the combination of voltages initially corresponds to the first idle state I1, the control circuit makes a switch to the second idle state I2 via combination 122. Vice versa, if the voltage combination before a write corresponds to second idle state I2, the control circuit makes a switch to the first idle state I1 via combination 122.

FIG. 12c illustrates the transitions to the read and erase states for the state diagram of FIG. 11b. Here another combination 127 is used for the selected row in the read state R. This combination may be reached directly from first idle state I1.

Driving of the unselected row conductors 18 imposes additional conditions on the voltages. The difference between voltage on the unselected row conductors 18 and the lowest and highest voltages of the column conductors during writing should be below Vf and above −Vr respectively. If there is a common upper limit D on the expected deviations of the voltages, this imposes conditions on the voltage differences dVread, dVerase, dVwrite between selected row conductors and unselected row conductors during reading, writing and erasing respectively:

$-Vr+D<V\text{read}-dV\text{read}<Vf-D$ $-Vr+D<V\text{erase}-dV\text{erase}<Vf-D$ $-Vr+D+V\text{diff}<V\text{write}-dV\text{write}<Vf-D$ In addition the circuit should satisfy the general inequalities that have been described earlier:

$-Vr-D-\text{reverse hysteresis threshold}<V\text{read}<-Vr-D$ $V\text{erase}<-Vr-D-\text{the reverse hysteresis threshold}$ $V\text{write}>Vf+D+\text{the forward hysteresis threshold}$ $V\text{write}-V\text{diff}<Vf-D$ In the driving scheme of FIG. 11a $V\text{read}=VRR/2-VCC, dV\text{read}=-VRR/2$ $V\text{erase}=-VCC, dV\text{erase}=-VRR$ $V\text{write}=VRR\ dV\text{write}=VRR/2$ $V\text{diff}=VCC/2$ In the driving scheme of FIG. 11b $V\text{read}=-VCC/2, dV\text{read}=-VRR$ $V\text{erase}=-VCC, dV\text{erase}=-VRR$ $V\text{write}=VRR\ dV\text{write}=VRR/2,$ $V\text{diff}=VCC/2$ In the driving schemes of FIG. 11a, b, as in the driving scheme of the embodiment of FIG. 9, the reverse hysteresis threshold is preferably at least twice D and preferably equal to twice D and Vread is preferably below −(VR+D) and preferably equal to this voltage.

$2D<\text{the reverse hysteresis threshold}$ $V\text{read}<-(Vr+D)$

As in the driving scheme of the embodiment of FIG. 9 the remaining most critical inequalities are associated with writing: to ensure that Vwrite is high enough to enforce writing, to ensure that Vwrite−Vdiff is not so high that current will flow from the selected row to unselected columns and finally the inequality to prevent current from flowing from unselected row conductors to active column conductors (the upper bound for Vwrite−dVwrite). Hence $V\text{write}>D+Vf+\text{the forward hysteresis threshold}$ $V\text{diff}>V\text{write}-Vf+D$ $dV\text{write}>V\text{write}-Vf+D$ Preferably, the circuit is designed so that these most critical inequalities substantially become equalities. In this case $V\text{write}=D+Vf+\text{the forward hysteresis threshold}$ $V\text{diff}=dV\text{write}=2D+\text{the forward hysteresis threshold}$ The driving schemes define relations between Vwrite, dVwrite, Vdiff and Vread which lead to further constraints on the voltages. In particular, since dVwrite=Vwrite/2:

$2(Vf-D)>V\text{write}>D+Vf+\text{the forward hysteresis threshold}$

As a result a value for Vwrite is only possible if $Vf>3*D+\text{the forward hysteresis threshold}$ In the driving schemes of FIGS. 11a,b, the inequalities also impose conditions on Vr. Due to the difference between the driving schemes these conditions are different for the two driving schemes: For the scheme of FIG. 11a:

$Vr>D+\text{the forward hysteresis threshold}$ or a corresponding condition for the driving scheme of FIG. 11b.

The value of Vf is determinative for the minimum allowable voltages and therefore for the minimum achievable power consumption. The voltages required for driving can be minimized if Vf substantially equals its minimum allowable value. Therefore, construction of the circuit so that Vf is minimal minimizes power consumption. Accordingly, the circuit is preferably constructed so that Vf substantially equals its minimum allowable value.

It should be noted that when one of the schemes of FIGS. 11a, b is used Vf can be made smaller than when the scheme of FIG. 9 is used (in which the smallest useful value of Vf equals 5*D plus the forward hysteresis threshold). Therefore these schemes make it possible to use less power consumption than the scheme of FIG. 9. The reason for this is that Vdiff equals half VCC in the schemes of FIGS. 11a,b instead of VCC as in the scheme of FIG. 9. This has the result that smaller values of Vf are allowed that still satisfy the condition that Vdiff must be smaller than Vr+Vf.

Although a set of mathematical inequalities has been given for the operation of the circuit, it should be understood that these inequalities are merely a formalized expression of desirable physical margins that have identified in words in this specification. It should be understood that the mathematical expression of these inequalities is merely a matter of convenience, at least for some skilled persons, for understanding the underlying purpose. The invention is not limited by this form of expression. If necessary the skilled person will be able to use the disclosed purpose behind these mathematical inequalities to derive inequalities that are expressed in a different form, or to verify the inequalities.

Although the invention has been described by means of a number of examples, it should be appreciated that the invention is not limited to these examples. For example, although different driving voltages have been shown that are in specific ratios to one another (VRR and VRR/2 and VCC and VCC/2), it should be appreciated that other ratios may be used, provided that the general inequalities are satisfied. However, ratio's of one to two between the voltages are preferred over more arbitrary ratio's, because a simple ratio like one to two makes it possible to ensure with a simple circuit that the predetermined relation between the driving voltages is accurately achieved.

Furthermore, although a number of states of control circuit 11 have been illustrated, it should be appreciated that in practice control circuit 11 may support more or fewer states and/or state transitions. For example, support for the dashed state transitions in FIG. 11a may be omitted. Alternatively, additional states may be added. For example the read state of FIG. 11b may be supported by a control circuit that implements the state diagram of FIG. 11a. In this case the circuit may perform a rapid read-erase-program cycle at a single address. As another example, a sleep state may be added wherein zero voltages are applied to all word and row conductors. In this case the circuit switches from the sleep state to the first idle state via an additional intermediate state after receiving a wake up command. In the additional intermediate state a voltage VRR/2 is applied to all row conductors, while all column conductors are at zero volts (Vss).

Furthermore, additional transitions between states may be used. This includes direct read-to-read state transitions and direct erase-to-erase state transitions wherein another row is selected. These direct transitions speed up a series of successive read or erase operations.

The invention claimed is:

1. A circuit comprising:
a memory matrix with rows and columns of cells, each cell containing a series arrangement of a resistance hysteresis element and a threshold element coupled between a row terminal and column terminal of the cell;
row conductors, each coupled to the row terminals of the cells in a respective row;
column conductors, each coupled to column terminals of the cells in a respective column;
driver circuits coupled to the row conductors and the column conductors;
a control circuit having control outputs coupled to the driver circuits, the control circuit being arranged to switch between respective discrete circuit states in response to commands, the circuit states including:
a first idle state, wherein the control circuit controls the driver circuits to drive all row and column conductors to one or more idle voltages;
an all-column update state, if wherein the control circuit controls the driver circuits to drive voltages at selected row conductors and all column conductors to a first and second voltage on mutually opposite sides of the one or more idle voltages respectively, and the voltages at the remaining row conductors to the one or more idle voltages;
a column selective update state, wherein the control circuit controls the driver circuits to drive voltages at selected row and column conductors in mutually opposite directions from the one or more idle voltages, and the voltages at the remaining column and row conductors to the one or more idle voltages;
a second idle state wherein the control circuit controls the driver circuits to drive the column conductors to the second voltage and to drive the voltages at the row conductors to the one or more idle voltages, the control circuit being arranged to switch back and forth to the column selective update state from the first idle state during execution of a column selective update command and back and forth to the all-column update state from the second idle state during execution of an all column update command, and to remain in the first and second idle state between execution of successive column selective update commands and all column update commands respectively.

2. A circuit according to claim 1, wherein the circuit states include a read state, the control circuit defining a first and second circuit state sequence for switching to the read state from the first idle state and from the second idle state respectively, neither of the first and second circuit state sequence completely including the other, the control circuit being arranged to switch from the first or second idle state to the read state in response to a read command via the first or the second respective circuit state sequence dependent on in which one of the idle states the control circuit remains before the read command.

3. A circuit according to claim 2, wherein the first circuit state sequence consists of the first idle state, and the read state and the second circuit state sequence consists of the second idle state, an intermediate state and the read state, the control circuit being arranged to control the driver circuits in the read state to drive the column conductors to one of the one or more idle voltages, to drive the selected row conductor to the first voltage and to drive the remaining row conductors to a further voltage in a direction opposite to the first voltage relative to the one or more idle voltages, the control circuit being arranged to control the driver circuits in the intermediate state to drive the column conductors to one of the one or more idle voltages and to drive the row conductors to the further voltage.

4. A circuit according to claim 2, wherein the first circuit state sequence consists of the first idle state, an intermediate state, and the read state, and the second circuit state sequence consists of the second idle state and the read state, the control circuit being arranged to control the driver circuits in the read state to drive a selected row conductor to one of the one or more idle voltages and to drive the remaining row conductors and the column conductors in a direction of the first voltage from the one or more idle voltages, the control circuit being arranged to control the driver circuits in the intermediate state to drive the row conductors in a same way as in the read state, and to drive the column conductors to the one or more idle voltages.

5. A circuit according to claim 1, wherein the control circuit is arranged to control the driver circuits in the column selective update state to drive voltages at selected row and column conductors to the second and first voltages respectively.

6. A circuit according to claim 5, wherein the cells are constructed so that there is a mutual difference between a first and second update threshold voltage difference, for updating with a voltage on the row terminal above and below a voltage on the second terminal respectively, and wherein directions of the first and second voltages relative to the one or more idle voltages are selected so that the voltage difference applied in the all-column update state is subject to the highest of the first and second update threshold differences.

7. A method of updating a memory matrix with rows and columns of cells, each cell containing a series arrangement of a resistance hysteresis element and a threshold element between a row terminal and column terminal of the cell, the method comprising:

receiving update commands;

providing a control circuit that defines at least the following circuit states:

a first idle state wherein the row and column terminals of the cells in all rows and columns are driven to one or more idle voltages;

an all-column update state wherein the row terminal of cells in selected rows and the column terminals of cells in all columns are driven to a first and second voltage on mutually opposite of the one or more idle voltages respectively, and the voltages at the row terminals of the cells in the remaining rows are driven to one or more idle voltages;

a column selective update state where in voltages at the row and column terminals of the cells in selected rows and columns are driven in mutually opposite directions from the one or more idle voltages, and the voltages at the row and column terminals of the cells in remaining rows and columns are driven to the one or more idle voltages; and a second idle state wherein the column terminals of all cells are driven to the second voltage and the row terminals of the cells are driven to the one or more idle voltages;

switching back and forth to the column selective update state from the first idle state during execution of a column selective update command;

switching back and forth to the all-column update state from the second idle state during execution of an all column update command;

retaining the control circuit in the first and second idle state, without switching to the second and first idle state between execution of successive column selective update commands and all column update commands respectively.

* * * * *